(12) United States Patent
Venugopal et al.

(10) Patent No.: US 9,345,163 B2
(45) Date of Patent: May 17, 2016

(54) MODULES TO CONTAIN INTERFACE CARDS

(71) Applicant: Hewlett-Packard Development Company, L.P., Houston, TX (US)

(72) Inventors: Raghavan V. Venugopal, Spring, TX (US); Chin-Lung Chiang, Taipei (TW); Patrick A. Raymond, Houston, TX (US); Chih-Chiang Chen, Taipei (TW)

(73) Assignee: Hewlett Packard Enterprise Development LP, Houston, TX (US)

( * ) Notice: Subject to any disclaimer, the term of this patent is extended or adjusted under 35 U.S.C. 154(b) by 221 days.

(21) Appl. No.: 13/906,287

(22) Filed: May 30, 2013

(65) Prior Publication Data

US 2014/0353264 A1 Dec. 4, 2014

(51) Int. Cl.
*H05K 7/14* (2006.01)

(52) U.S. Cl.
CPC .................................. *H05K 7/1487* (2013.01)

(58) Field of Classification Search
CPC . H05K 7/1487; H05K 7/1418; H05K 7/1425; H05K 13/0069; H05K 7/1404; H05K 7/1409; G06F 1/18
USPC ...................................................... 211/41.17
See application file for complete search history.

(56) References Cited

U.S. PATENT DOCUMENTS

| | | | |
|---|---|---|---|
| 5,544,006 A * | 8/1996 | Radloff et al. ........... | 361/679.32 |
| 5,767,999 A * | 6/1998 | Kayner ..................... | 398/164 |
| 6,128,196 A * | 10/2000 | Hoyle et al. .............. | 361/752 |
| 6,169,662 B1 * | 1/2001 | Clark et al. .............. | 361/754 |
| 6,288,911 B1 * | 9/2001 | Aoki et al. ................ | 361/801 |
| 6,302,714 B1 * | 10/2001 | Bolognia et al. .......... | 439/157 |
| 6,320,760 B1 * | 11/2001 | Flamm et al. ............. | 361/801 |
| 6,324,065 B1 * | 11/2001 | Nelson et al. ............. | 361/754 |
| 6,381,148 B1 * | 4/2002 | Daskalakis et al. ....... | 361/801 |
| 6,442,037 B1 * | 8/2002 | Boe ........................... | 361/759 |
| 6,597,581 B2 * | 7/2003 | Barringer et al. ......... | 361/756 |
| 6,721,190 B1 * | 4/2004 | Bender et al. ............. | 361/802 |
| 6,970,363 B2 * | 11/2005 | Bassett et al. ............. | 361/801 |
| 7,118,281 B2 * | 10/2006 | Chiu et al. ................ | 385/53 |
| 7,130,200 B1 * | 10/2006 | Liu ............................ | 361/801 |
| 7,283,371 B1 * | 10/2007 | Grouell et al. ............ | 361/741 |
| 7,364,447 B1 * | 4/2008 | Desrosiers et al. ........ | 439/157 |
| 7,573,719 B2 * | 8/2009 | Allcock et al. ............ | 361/752 |
| 7,576,979 B1 * | 8/2009 | Dearborn et al. ......... | 361/679.38 |
| 7,652,872 B1 * | 1/2010 | Mease et al. .............. | 361/679.02 |
| 7,742,292 B1 * | 6/2010 | Chong, Jr. ................ | 361/679.39 |
| 8,077,456 B2 * | 12/2011 | Yoshimaru et al. ....... | 361/679.48 |
| 8,203,851 B2 * | 6/2012 | Boetzer ..................... | 361/801 |
| 8,427,824 B2 * | 4/2013 | Peng et al. ................ | 361/679.4 |
| 8,749,966 B1 * | 6/2014 | Boudreau et al. ......... | 361/679.33 |
| 8,760,881 B2 * | 6/2014 | Saito et al. ................ | 361/756 |
| 8,848,358 B2 * | 9/2014 | Peng et al. ................ | 361/679.32 |
| 8,898,362 B2 * | 11/2014 | Sun ........................... | 710/300 |

(Continued)

FOREIGN PATENT DOCUMENTS

DE 102004002737 A1 8/2005

*Primary Examiner* — David M Sinclair
*Assistant Examiner* — Robert Brown
(74) *Attorney, Agent, or Firm* — Hewlett Packard Enterprise Patent Department

(57) ABSTRACT

A module is insertable into a cage based on movement along a first axis. The module is to contain an interface card. A mechanism is to move the module along a second axis perpendicular to the first axis, to couple the interface card with the cage.

14 Claims, 7 Drawing Sheets

(56) References Cited

U.S. PATENT DOCUMENTS

| | | | |
|---|---|---|---|
| 2002/0081890 A1* | 6/2002 | Obermaier | 439/377 |
| 2002/0131242 A1* | 9/2002 | Nagasawa | 361/727 |
| 2003/0043553 A1* | 3/2003 | Barringer et al. | 361/756 |
| 2003/0043564 A1* | 3/2003 | Barringer et al. | 361/807 |
| 2003/0112596 A1* | 6/2003 | Shih | 361/685 |
| 2004/0047128 A1* | 3/2004 | McClelland et al. | 361/690 |
| 2007/0127202 A1* | 6/2007 | Scicluna et al. | 361/685 |
| 2008/0180925 A1* | 7/2008 | McClure et al. | 361/756 |
| 2008/0239689 A1* | 10/2008 | Okamoto et al. | 361/807 |
| 2008/0244052 A1* | 10/2008 | Bradicich et al. | 709/223 |
| 2009/0213559 A1* | 8/2009 | Yang et al. | 361/752 |
| 2009/0231803 A1* | 9/2009 | Chang | 361/679.47 |
| 2009/0296322 A1* | 12/2009 | Yang et al. | 361/679.01 |
| 2009/0323274 A1* | 12/2009 | Lin | 361/679.48 |
| 2010/0271766 A1* | 10/2010 | Lin | 361/679.02 |
| 2011/0007464 A1* | 1/2011 | Leigh | 361/679.01 |
| 2012/0194350 A1* | 8/2012 | Crisp et al. | 340/815.42 |

\* cited by examiner

MODULES TO CONTAIN INTERFACE CARDS

BACKGROUND

Computing systems may interface with removable components that are enclosed in a module. Some drawer-based modules are based on insertion/removal, e.g., by pushing and pulling a module having a connector located on the back of the drawer.

BRIEF DESCRIPTION OF THE DRAWINGS/FIGURES

DETAILED DESCRIPTION

Example systems provided herein enable a module to be plugged in and out of a cage, and include the benefit of a 2-axis approach for module removal and insertion. Examples may be compatible with existing and future computer interface form factors, providing backward compatibility with existing and future interface cards or other devices. An example system (e.g., a server) may enable a cage module to be inserted and/or removed from a system cage without a need to open a top cover of the system. Examples may support hot-plug functionality of cage modules, enabling interface cards that are not typically associated with hot-plug functionality to be hot-plugged using the various examples provided herein.

Examples described herein having a 2-axis approach may support various types of Peripheral Component Interconnect Express (PCIe) interface cards, enabling easy insertion of the module along a first axis, and securely interfacing the PCIe module along a second axis into a corresponding PCIe receptor cage coupling in the cage. The module may be securely latched when inserted into and interfaced with the cage, and may be unlocked easily with a latch to release the module, without disturbing operation of a computing system associated with the cage and module.

Figure 1:
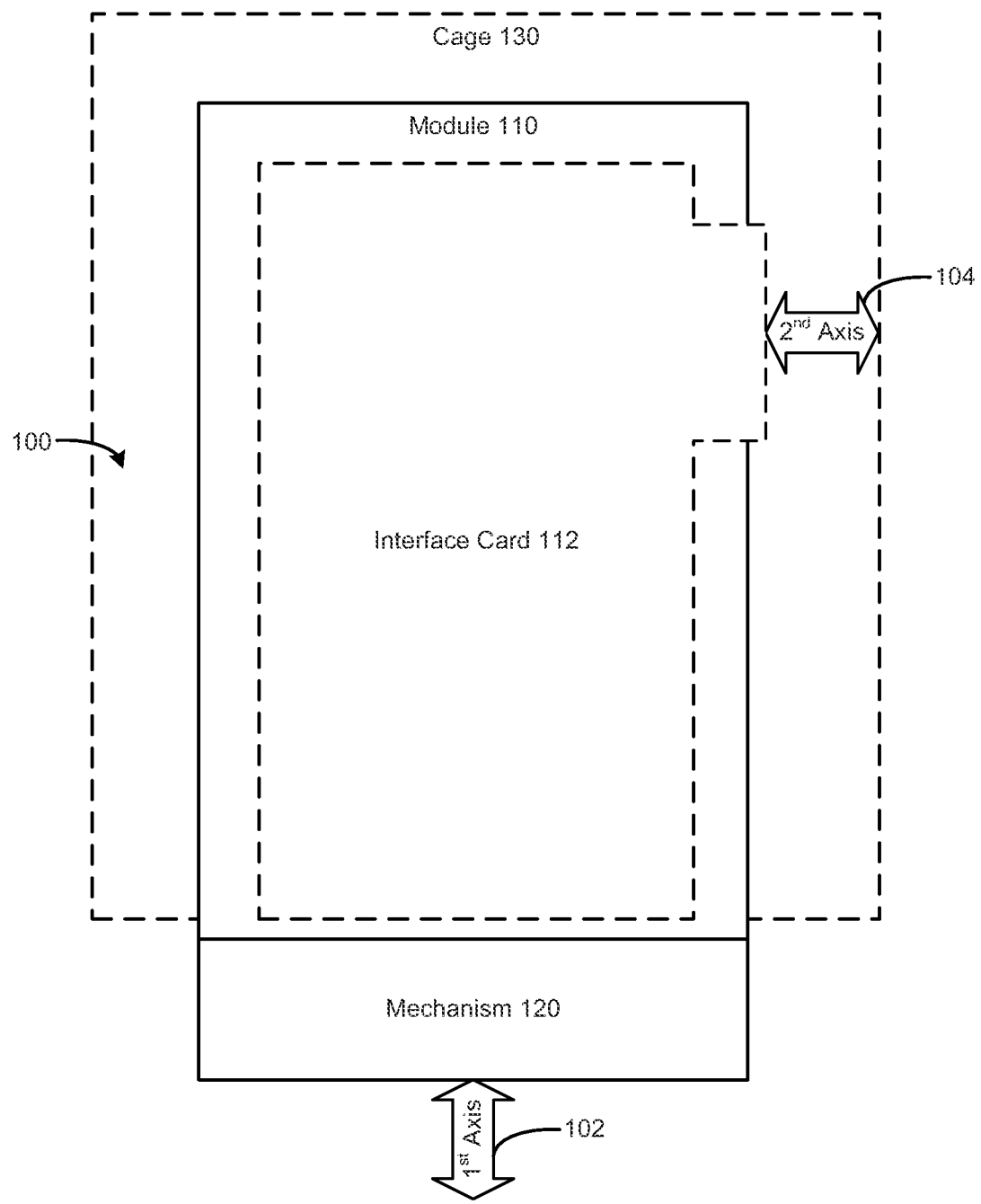
FIG. 1 is a block diagram of an apparatus including a module and mechanism according to an example.

FIG. 1 is a block diagram of an apparatus 100 including a module 110 and mechanism 120 according to an example. The module 110 initially may be insertable into cage 130 along a first axis 102. The module 110 may contain interface card 112, which may be interfaced with the cage 130 based on movement of the module 110 relative to the cage 130 along a second axis 104.

The module 110 may be formed as an enclosure to protect the interface card 112. The module enclosure may be made of metal, plastic, or other protective materials, including materials to block electromagnetic interference (EMI) and/or radio-frequency interference (RFI). The module 110 may expose a portion of the interface card 112 for coupling with the cage 130.

Examples of module 110 may house interface cards 112 that include storage devices. Example interface cards 112 may include storage based on Serial Attached SCSI (SAS), Serial ATA (SATA), PCI, and other formats. By virtue of the 2-axis compatibility provided by the module 110, apparatus 100 may be fully compliant with the PCIe specification, using a PCIe bus as the transmission medium. In contrast to SAS and SATA based storage solutions using special data formatting, PCIe-based storage solutions avoid a need for further conversion of data into special formats. Thus, examples of apparatus 100 may interact with the interface card 112 without a need for data conversion by a processor (e.g., as would be done using the SAS protocol) before data may be written to a drive in the interface card 112. Data for a PCIe-based storage solution may be native to a system processor (e.g., central processing unit (CPU)), and minimize read and/or write latencies to provide improved speed and performance. Similar to a SAS subsystem server, examples provided herein may support hot-plug removal of a PCIe-based storage device without suffering detrimental effects to operation of the server (i.e., the server does not lock up or 'bluescreen').

Module 110 may be formed as an enclosure for a PCIe interface card 112, enabling backward compatibility with existing and future PCIe interface cards, while providing hot plug support via electronics to manage the PCIe bus and computer. The interface card 112 may include a PCIe-based storage such as a hard disk drive (HDD), solid-state drive (SSD, e.g., based on NAND/flash technology), a hybrid of HDD, SSD, and/or memory, or other forms of storage. The module 110 enables the interface card 112 to be easily removed and replaced from cage 130, e.g., when the interface card 112 needs servicing or replacement. For example, apparatus 100 may include an array of storage devices based on a redundant array of independent disks (RAID), where one storage device fails and is easily replaced based on hot-plugging, enabling the array to recover on-the-fly without a need to shut down the entire array. Other types of interface card 112 devices are also supported (e.g., a rendering system using a plurality of PCIe video cards as the interface cards 112). Examples of apparatus 100 may increase serviceability of interface card 112. In an example, fast storage may be directly connected to higher performance CPUs, within a server, workstation, and/or desktop environment, enabling flexible direct attached storage within such computing devices. In alternate examples, module 110 may be used in a cage for shared storage, including a cage external to a computing device and connected through a communication channel like fiber or SAS. Thus, example systems 100 may be stand-alone or may be integrated with a processor, memory, and/or computing system.

System 100 may be fully compliant with interface standards, such as the Standard PCI Express® Card Electromechanical (CEM) Specification. For example, system 100 may be compliant with a requirement to interface the interface card 112 along second axis 104, for PCIe add-on interface cards. System 100 may be compatible with interface cards 112 having form factors including low profile, full height half length (FHHL), half height half length (HHHL), special, and other types of PCIe and non-PCIe interface cards, including future specifications and interoperability with riser cards and so on.

Figure 2:
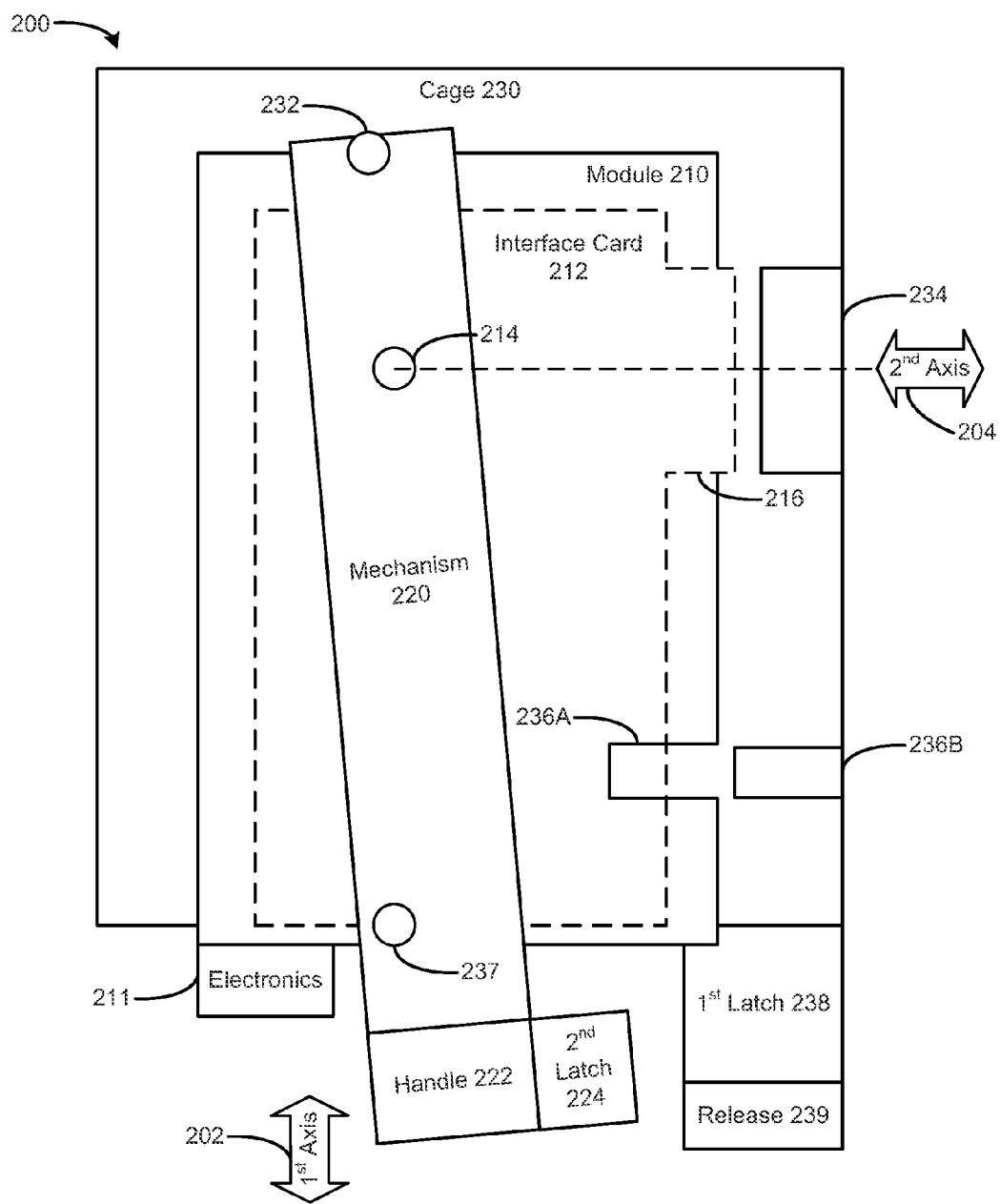
FIG. 2 is a block diagram of a system including a cage, module, and mechanism according to an example.

FIG. 2 is a block diagram of a system 200 including a cage 230, module 210, and mechanism 220 according to an example. Module 210 is capable of being interested into cage 230 along the first axis 202, and capable of being coupled to the cage 230 along the second axis 204. Module 210 may include an alignment mechanism 236A and electronics 211. The cage 230 may include fulcrum 232, cage coupling 234, alignment mechanism 236B, first latch 238, and release 239. The cage coupling 234 is to receive a corresponding card coupling 216 of the interface card 212. The mechanism 220 may include pivot 214, handle 222, and second latch 224. The mechanism 220 may be coupled to the module 210 and/or the cage 230. A feedback mechanism 237 may be included in the system 200.

FIG. 2 shows module 210 inserted with mechanism 220 partially moved to the right. Initially, the module 210, along with its mechanism 220, are insertable into the cage 230 by pushing on the handle 222 along the first axis 202. The module 210 will come to rest inside the cage 230, at which point an end of the mechanism 220 may engage with the fulcrum 232. The handle 222 may then be moved along the second axis 204, causing the mechanism 220 to move the module 210 along the second axis 204 to engage the card coupling 216 with the cage coupling 234. Thus, module 210 enables electrical engagement of the interface card 212 with the cage 230 without having to open a housing to accommodate the 2-axis functionality. The 2-axis accommodation of the mechanism 220 enables engagement of the module 210 along second axis 204 that would otherwise be blocked by a housing or portion of the cage 230.

Other variations are possible. As described above, the mechanism 220 may be coupled to the module 210 via the pivot 214, such that the mechanism 220 may engage the fulcrum 232 when the module 210/mechanism 220 assembly is inserted into the cage 230. In an alternate example, the mechanism 220 may be coupled to the cage 230 via the fulcrum 232, pivotable about the fulcrum 232 of the cage 230. Thus, the mechanism 220 may engage the module 210 at the pivot 214 when the module 210 is inserted in the cage 230/mechanism 220 assembly. In an alternate example, the mechanism 220 may position the pivot 214 to engage a side of the module 210. The various examples enable the mechanism 220 to apply a coupling force to the module 210 along the second axis 204. As illustrated, the pivot 214 is aligned with a center of the card coupling 216 and cage coupling 234, to encourage a balanced force to be applied when interfacing the card coupling 216 and cage coupling 234. In alternate examples, the pivot 214 may be non-centered, and may be located away from the second axis 204, relying on alignment mechanisms 236 or other mechanisms to ensure the coupling is not misaligned or crooked.

The mechanism 220 includes handle 222, to receive an insertion force to insert the module 210 into cage 230 along the first axis 202. The handle 222 also is to receive a coupling force, to enable the mechanism 220 to provide transverse motion of the module 210 along the second axis 204 to engage electrical connectors of the module 210 with electrical connectors of the cage 230. The handle 222 may be formed to receive forces to disengage and remove the module 210. In an example, the handle 222 may be formed to include an easily grasped ring enabling a user to push and pull the handle 222 in multiple directions.

The mechanism 220 may be formed to have a length that extends substantially the entire length of the module 210 and beyond, to enable advantageous mechanical leverage. For example, the lever may multiply a mechanical advantage to provide an increased insertion force at the pivot 214, relative to the handle force applied to the handle 222.

The mechanism 220 may include a latch mechanism, labeled as second latch 224 in the figures. In an example, second latch 224 may be formed as an extension of the mechanism 220, or as an extension of the handle 222. In an example, the second latch 224 may be formed as a protrusion to form a clip that interfaces with the first latch 238 of the cage 230. The second latch 224 may be formed to align with the first latch 238 when the module 210 is fully engaged with the cage 230 (i.e., when the card coupling 216 is electrically coupled to the cage coupling 234). Accordingly, a length of the mechanism 220 to provide leverage, and an offset of the mechanism 220 to provide a range of motion for coupling, may be considered when aligning the location of the latches 238, 224 and handle 222 on the mechanism 220.

The cage coupling 234 may be provided as a standard expansion slot of a server computing system, such as a PCIe expansion interface slot of a motherboard of the computing system. The cage coupling 234 also may be provided by a riser card, e.g., an extension card rising up from an expansion slot of the motherboard to provide additional coupling interfaces on the riser card. The riser card may be coupled to a motherboard slot to provide a plurality of PCIe expansion interface slots.

The cage coupling 234 may include electronics for supporting hot-plug functionality for the PCIe bus. Thus, system 200 may be provided as a server including the modified riser card and cage 230 to enable, e.g., a particular model of a server family to support hot-pluggable PCIe interface cards 212. The module 210 also may include electronics 211. Electronics 211 may enable hot-plug interaction and control. In an example, electronics 211 may include a switch/push-button and indicator lamps (e.g., light-emitting diodes (LEDs). The switch may enable generating an electrical signal to communicate to a CPU (e.g., via the PCIe bus) an intention to hot-plug the module 210 to/from the cage coupling 234. The indicator lamps may blink to communicate acknowledgment by the CPU that the system is ready to receive/remove the module 210. Electronics 211 may include intelligence to handle the hot-pluggable aspect of the interface/bus. Electronics 211 may be integrated with the cage coupling 234, as an alternative and/or in addition to the electronics 211 shown on the module 210.

In an example, a user may push a button on the module 210, such as a push-button on the electronics 211, that warns the CPU of an intention to perform a hot plug. In response, the CPU may begin preparations for the hot-plug, and send back to the module 210 (e.g., to electronics 211 or other interface on the cage 230 etc.) a signal that flashes an LED warning that it is not yet safe to remove the module 210. Once the system 200 finishes a clean-up procedure to prepare for the hot-plug, the CPU may send a signal to stop flashing the LED or otherwise indicate a safe mode (e.g., a solid green LED) to remove the module 210. The electronics 211 also may send a similar warning/preparatory signal to the interface card 212, e.g., informing the interface card 212 to set its storage device to a parked or safe mode. Electronics 211 also may be incorporated into interface card 212, cage 230, or other aspects of system 200.

The cage 230 and module 210 may align with each other based on alignment mechanisms 236A, 236B. In an example, the alignment mechanism 236B is formed as a pin on the cage 230, and a corresponding hole 236A may be formed in the module 210. The alignment mechanisms 236A, 236B are to help position the module 210, give feedback as to whether the module 210 is sufficiently inserted along the first axis 202, and give feedback as to whether the mechanism 220 is ready to be actuated to move the module 210 along the second axis 204. Additionally, the mechanisms 236A, 236B may prevent the card coupling 216 from crookedly interfacing with the cage coupling 234.

System 200 also may include feedback mechanism 237. In an example, mechanism 220 is a lever arm, and feedback mechanism 237 is a detent that actuates based on how the mechanism 220 is pivoted through its actuation range of motion. Additional forms of feedback also may be provided, e.g., via first and second latches 238, 224 that engage each other with a positive force feedback audible click.

In use, the module 210 may be inserted into the cage 230 along first axis 202 until the alignment mechanisms 236A, 236B are aligned. In an example, the fulcrum 232 provides a stop for the module 210, allowing the mechanism 220 to engage the fulcrum 232 of the cage 230, corresponding to alignment being achieved at the alignment mechanisms 236A, 236B. The handle 222 may be used push the module 210 into the cage 230.

Once the module 210 is fully inserted and aligned, the handle 222 may be used to lever the module 210 along the second axis 204 to couple the interface card 212 with the cage coupling 234. In an example, the mechanism 220 is coupled to the module 210, and the mechanism 220 may pivot about the pivot 214 to push against the fulcrum 232. In an alternate example, the mechanism 220 is coupled to the cage 230, and the mechanism 220 may pivot about the fulcrum 232 to push against the pivot 214. Other configurations are possible, such as aligning the mechanism 220 to a side of the cage 230, enabling the pivot 214 to be located on a side of the module 210.

Figure 3:
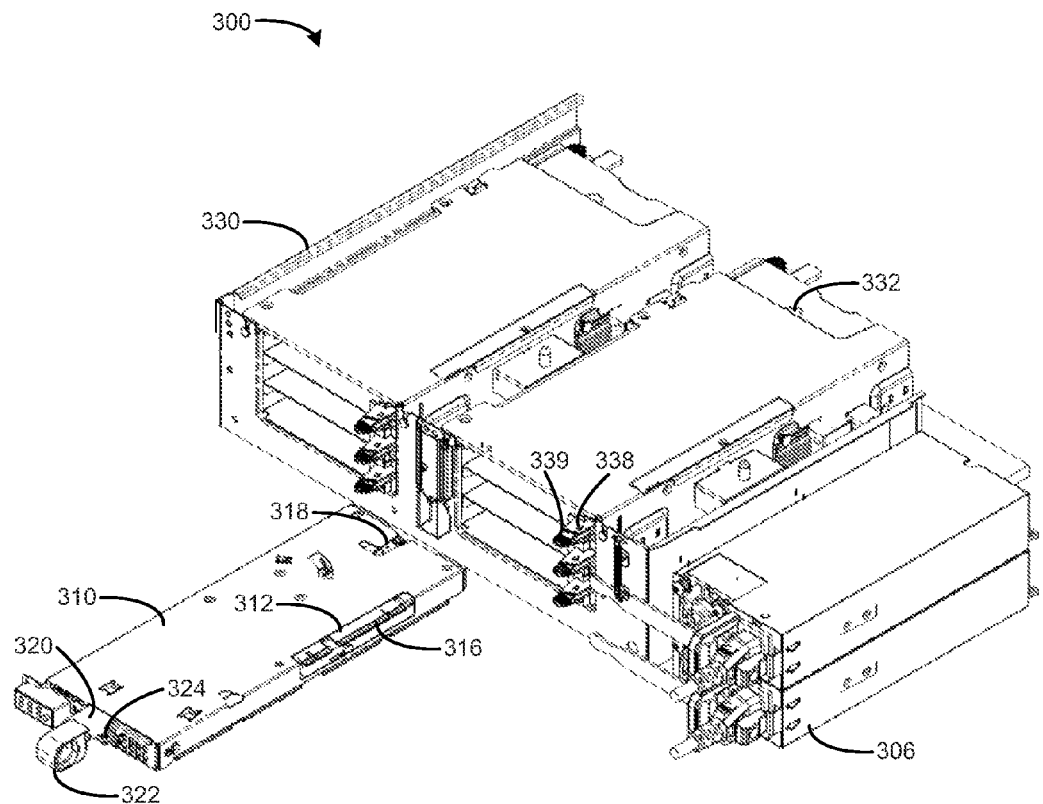
FIG. 3 is a perspective view of a system including a cage and module according to an example.

FIG. 3 is a perspective view of a system 300 including a cage 330 and module 310 according to an example. The module 310 is shown with the handle 322 of the mechanism 320 centered in an unlatched position, ready for receiving an insertion force to insert the module 310 into the cage 330. The module 310 and/or the mechanism 320 may include a latch, detent, spring, or other mechanism to secure the mechanism 320 in the unlatched position as shown, to better ensure that the back end of the mechanism 320 may align with and engage the fulcrum 332 when the module 310 is inserted into the cage 330. A portion of the interface card 312 is visible within the module 310, including card coupling 316 corresponding to the electrical pins of a PCIe interface card in the specific example illustrated.

For installation, the module 310 is to be inserted into the cage 330. Insertion enables the module 310 to be aligned. For example, alignment may enable an end of the mechanism 320 to engage the fulcrum 332 of the cage 330, e.g., via the module cutout 318 that enables the fulcrum 332 to pass through the surface of the module 310. When aligned, the mechanism 320 may act on the fulcrum 332, and enable the first latch 338 of the cage 330 to align with the second latch 324 of the mechanism 320. The first latch 338 is shown including release 339 formed as a tab extension of the first latch 338.

System 300 is also shown including system electronics 306. For example, system 300 is a server including cage 330 and system electronics 306 including power supplies, CPU (s), and other supporting electronics for a computing system. Cage 330 is shown having six bays to receive up to six removable modules 310. System 300 thus may include two riser cards extending vertically from a system motherboard, to provide cage couplings for each vertical stack of three bays (i.e., each riser card includes three cage couplings). Each module 310 may be inserted/removed separately (e.g., based on a hot-plug operation), without having to open a top of the cage 330.

Figure 4:
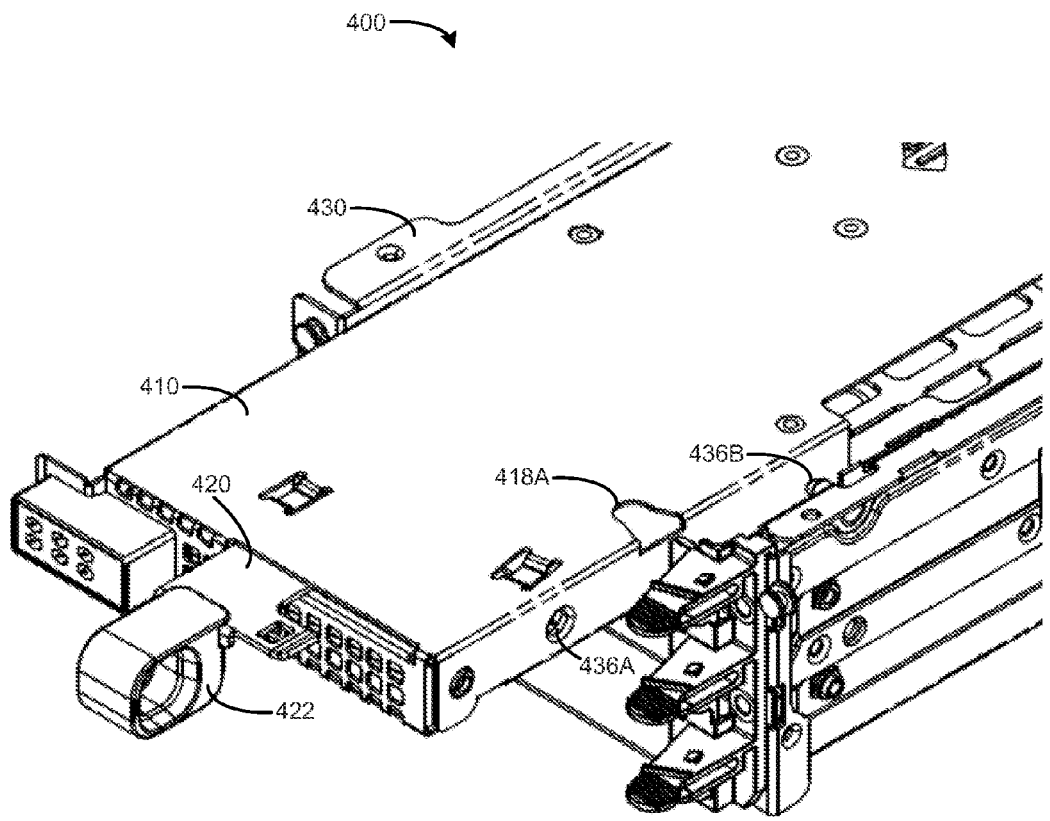
FIG. 4 is a perspective view of a system including a cage and module according to an example.

FIG. 4 is a perspective view of a system 400 including a cage 430 and module 410 according to an example. An upper portion of the cage 430 is removed for visibility, to expose the module 410. The module 410 is shown partially inserted into the cage 430, e.g., by using handle 422 to insert the module 410, while the mechanism 420 is in the default insertion (non-latched) position.

While inserting the module 410, the alignment mechanism 436B of the cage 430 (e.g., a pin extending from the cage 430) may stabilize a side of the module 410 and prevent wobble during insertion. Thus, the module 410 may move smoothly into the cage 430, based on guidance from the alignment mechanism 436B. When the module 410 is fully inserted, the alignment mechanism 436B of the cage 430 is to align with the alignment mechanism 436A (e.g., a hole in a side of the module 410). Although one alignment mechanism 436B is shown on cage 430, additional mechanisms may be used (e.g., extending from other surfaces of the cage 430, such as the walls, ceiling, and floor of each bay of the cage 430).

Alignment mechanisms 436A, 436B may be tapered to encourage alignment, and may allow for additional tolerances for insertion forces and potential misalignments, e.g., if the mechanism 422 is actuated when the module is not completely inserted/aligned. In an example, the alignment mechanisms may cause the mechanism 420 to engage the fulcrum of the cage 430, even if the module is not fully inserted/aligned when the mechanism 420 is actuated.

The module cutout 418A also may be formed on the module 410. In an example, the module cutout 418A is to interact with a circular protrusion extending downward from a ceiling of the cage 430 (not shown, may be similar protrusion to engage the module 410 as the fulcrum is to engage the mechanism). The module cutout 418A may be tapered as shown, to encourage proper alignment/positioning of the module 410, and accommodate any potential misalignments by self-centering interaction with the cage 430.

Figure 5:
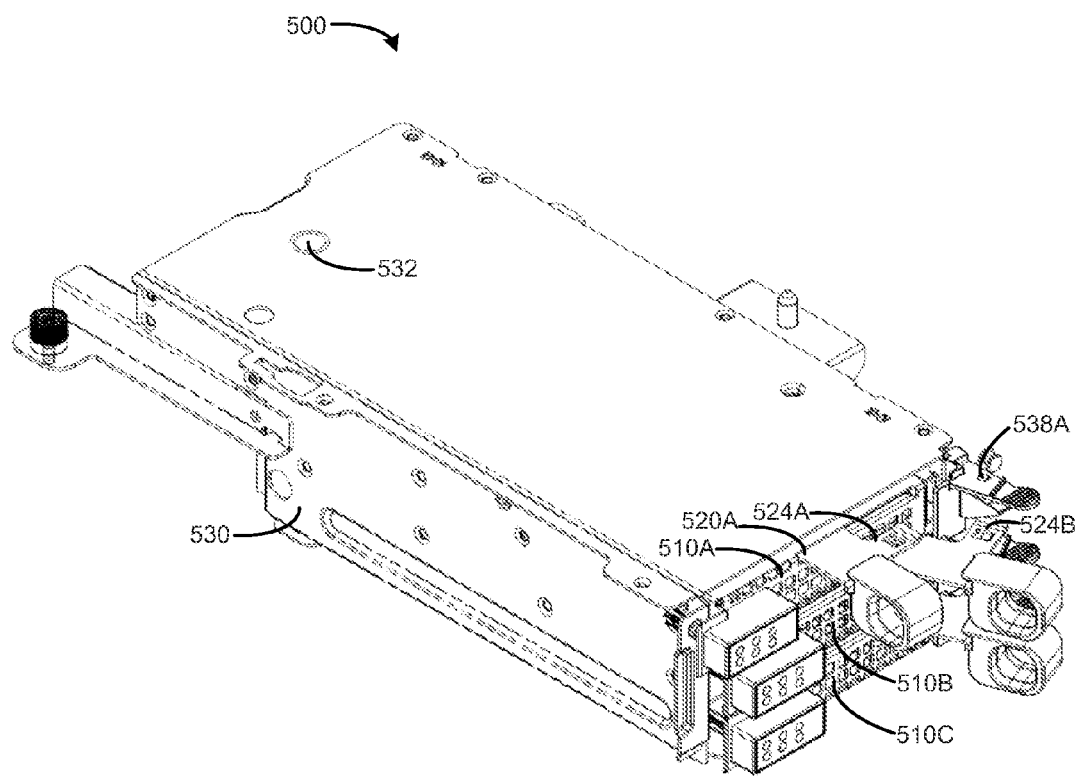
FIG. 5 is a perspective view of a system including a cage and module according to an example.

FIG. 5 is a perspective view of a system 500 including a cage 530 and modules 510A, 510B, 510C according to an example. The module 510A is shown fully inserted with the mechanism 520A at the default position such that second latch 524A is disengaged from first latch 538A. Mechanism 520A is shown aligned parallel to a side of the module 510A, to align with the fulcrum 532 of cage 530 that extends downward to act as a stop for and otherwise interact with the mechanism 520A.

The modules 510B and 510C illustrate their handles moved over to engage the modules 510B, 510C with the cage 530. Corresponding latch 524B is securely engaged (along with latch 524C of module 510C, not visible). With those mechanisms/handles pulled to the right side as shown, the modules 510B, 510C also are shown shifted over to a right side of the cage 530. In other words, the illustrated example enables the entire module to move when actuated by the corresponding mechanism. In an alternate example, the mechanism may actuate the interface card to move within the module, such that the module may remain stationary. In an alternate example, the module may include a movable sub-portion that moves with the interface card, in contrast to a remaining portion of the module that remains stationary.

Thus, FIG. 5 visually illustrates how actuation and latching of the mechanisms may move the modules 510B, 510C the right, in contrast to the upper module 510A that is still positioned toward the left of the cage 530. The modules 510B, 510C may be moved relative to the cage 530 based on the lever arm interaction between mechanism 520, a pivot, and the fulcrum 532.

The first latch 538A may provide positive feedback by capturing the corresponding latch (e.g., hole) in the mechanism 520A, providing easily appreciated visual and/or tactile confirmation that the mechanism 520A has been pushed far enough over to ensure proper engagement between the interface card of the module 510A and the riser card in the cage.

Figure 6A:
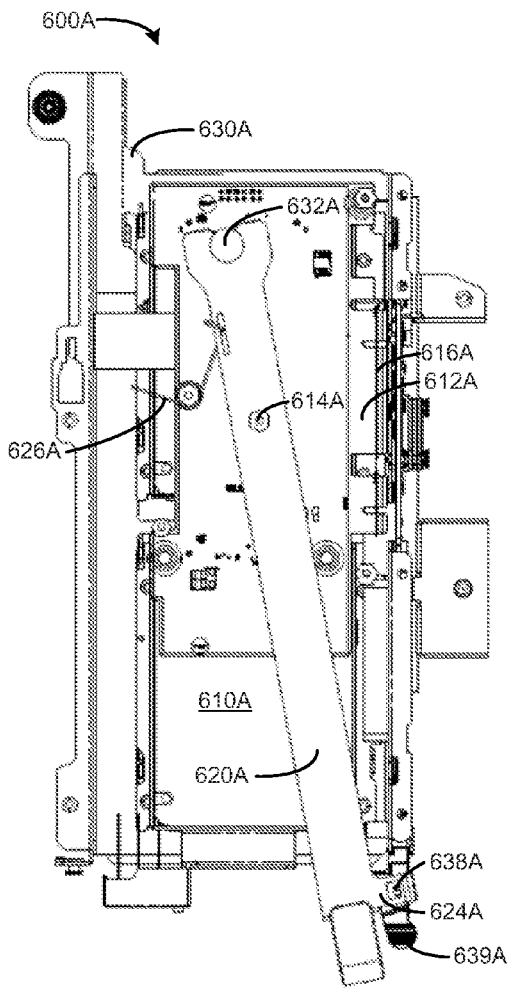
FIG. 6A is a perspective view of a system including a cage and module according to an example.

FIG. 6A is a perspective view of a system 600A including a cage 630A and module 610A according to an example. The mechanism 620A is visible, showing pivot 614A and fulcrum 632A. The mechanism 620A also may be biased (e.g., toward a default position) based on spring 626A. The spring 626A is shown coupled to a side of the mechanism 620A, although in alternate examples the spring may be arranged differently (e.g., centered about the pivot 614A, and/or coupled to the cage 630A in examples where the mechanism 620A is also coupled to the cage 630A). A portion of the interface card 612A is also visible, along with its card coupling 616A. The card coupling 616A is shown moved to the right to fully engage the cage 630A (although for visual clarity, a cage coupling is not shown in FIG. 6A).

The system 600A shows the module 610A fully engaged, as confirmed by the position of the mechanism 620A and the fully engaged first and second latches 638A, 624A, along with the mechanism 620A engaging the fulcrum 632A. The release 639A is shown protruding, enabling an ergonomic and convenient mechanism for depressing the release 639A to disengage the latches 638A, 624A. The mechanism may be pivotably coupled to the module 610A, and in alternate examples, may be coupled to the cage 630A (not shown in FIG. 6A, to reveal the underlying components).

Figure 6B:
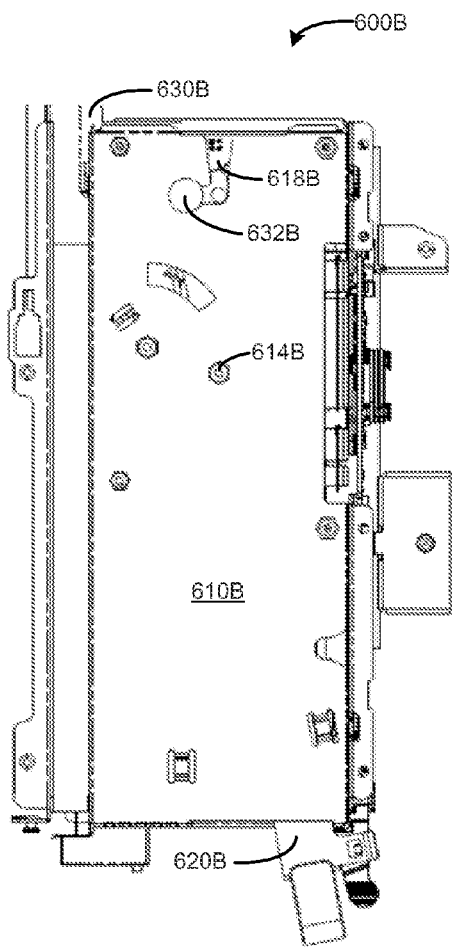
FIG. 6B is a perspective view of a system including a cage and module according to an example.

FIG. 6B is a perspective view of a system 600B including a cage 630B and module 610B according to an example. In the example of FIG. 6B, the mechanism 620B is pivotably coupled within the module 610B, although in alternate examples, the mechanism may be pivotably coupled external to the module 610B and/or to the cage 630B.

The module 610B is shown with a module cutout 618B to receive the fulcrum 632B. Upon insertion of the module 610B into cage 630B, the module cutout 618B may accommodate receiving the fulcrum 632B along a first axis to an extent where the cutout also serves as a stop for movement along the first axis. The module cutout 618B also then may accommodate receiving the fulcrum 632B along a second axis, also serving as a stop for movement along the second axis. As shown, the module cutout 618B has allowed the module 610B to have moved in an L-shaped motion, along the first and second axes, guiding movement of the module 610B based on interaction with the fulcrum 632B of the cage 630B to accommodate the 2-axis insertion and coupling of, e.g., a PCIe device according to the PCIe standards.

Figure 7:
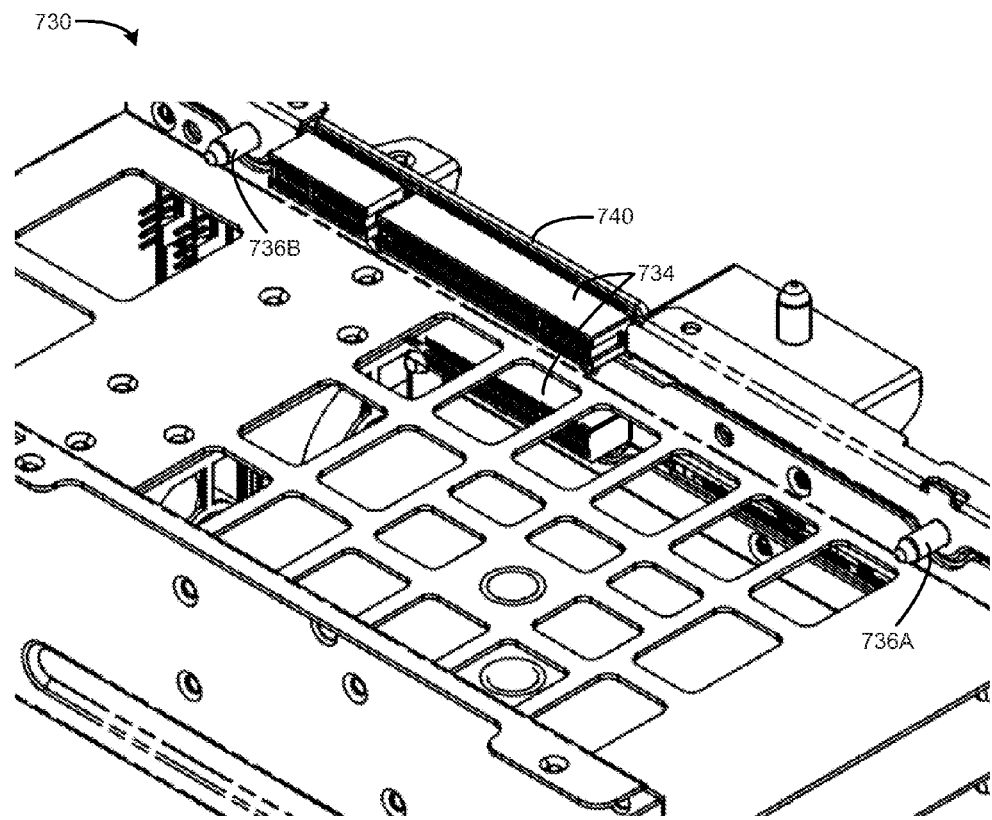
FIG. 7 is a perspective view of a cage according to an example.

FIG. 7 is a perspective view of a cage 730 according to an example. A portion of the cage 730 has been cut-away to reveal underlying details. The cage 730 includes first and second alignment mechanisms 736A, 736B, illustrated as tapered pins. A module to be inserted in cage 730 may include corresponding tapered holes to receive the first and second alignment mechanisms 736A, 736B. A side of the inserted module may slide along the pins to ensure smooth insertion. Additional alignment pins also may be positioned on a near side of the cage 730, although in the illustrated example, the inserted module may slide against a side of the cage 730 itself, to align the module during insertion.

Riser card 740 is visible, showing a plurality of cage couplings 734 positioned at different vertical heights corresponding to different bays of the cage 730. Thus, the cage 730 may receive a plurality of modules, each aligned by a plurality of alignment mechanisms, to securely engage the cage couplings 734 provided by at least one riser card 740.

What is claimed is:

1. An apparatus comprising:
   a module to contain an interface card, wherein the module is insertable into a cage based on movement along a first axis; and
   a mechanism pivotably interacting with the module based on a pivot, to move the module along a second axis perpendicular to the first axis, to couple the interface card with the cage;
   wherein the pivot is positioned away from edges of the module, substantially aligned with a center of a coupling of the interface card, to apply an insertion force from the mechanism to the coupling of the interface card along the second axis.

2. The apparatus of claim 1, wherein the mechanism includes a lever arm pivotably coupled to the module at the pivot.

3. The apparatus of claim 2, wherein the lever arm is to engage and pivot about a fulcrum the cage when the module is inserted in the cage, to move the pivot relative to the fulcrum.

4. The apparatus of claim 1, wherein a lever arm length substantially corresponds to at least an enclosure length to provide mechanical leverage.

5. The apparatus of claim 1, further comprising an alignment mechanism to stabilize movement of the module along at least one of the first axis and the second axis.

6. The apparatus of claim 1, further comprising a feedback mechanism to provide feedback regarding movement of the module along at least one of the first axis and second axis.

7. The apparatus of claim 1, wherein the interface card is a Peripheral Component Interconnect (PCI) card.

8. An apparatus comprising:
   a cage to receive a module along first axis;
   a mechanism pivotably interacting with the module based on a pivot, to move the module along a second axis perpendicular to the first axis; and
   a coupling to interface with an interface card contained in the module along the second axis;
   wherein the pivot is positioned away from edges of the module, substantially aligned with a center of the coupling of the interface card, to apply an insertion force from the mechanism to the coupling of the interface card along the second axis.

9. The apparatus of claim 8, wherein the mechanism includes a lever arm pivotably coupled to the cage at a fulcrum, wherein the lever arm is to move the module along the second axis based on contact with the module at the pivot.

10. The apparatus of claim 8, wherein the cage includes a PCI riser card including the coupling to interface with a PCI card contained in the module.

11. A system, comprising:
    a cage including a coupling;
    a module to contain an interface card, wherein the module is insertable into the cage based on movement along a first axis; and
    a mechanism pivotably interacting with the module based on a pivot, to move the module along a second axis perpendicular to the first axis, to couple the interface card with the cage via the coupling;
    wherein the pivot is positioned away from edges of the module, substantially aligned with a center of a coupling of the interface card, to apply an insertion force from the mechanism to the coupling of the interface card along the second axis.

12. The system of claim 11, wherein the mechanism includes a handle to receive forces to insert and remove the module along the first axis, and couple and decouple the module along the second axis.

13. The system of claim 11, further comprising:
- a first latch coupled to the cage; and
- a second latch coupled to the mechanism to interact with the first latch, to secure the mechanism in a position coupling the interface card with the cage.

14. The system of claim 13, wherein the first latch includes a release, to disengage the first latch from the second latch.

* * * * *